(12) United States Patent
Yahiaoui (10) Patent No.: US 6,856,181 B1
(45) Date of Patent: Feb. 15, 2005

(54) STABILITY ROBUSTNESS USING A NON-INTEGER ORDER FILTER IN A CIRCUIT

(75) Inventor: Youcef Yahiaoui, Lake Stevens, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/335,457

(22) Filed: Dec. 30, 2002

(51) Int. Cl.[7] .............................................. H03L 7/06
(52) U.S. Cl. ........................................................ 327/156
(58) Field of Search ................................. 327/146–163, 327/551–553; 331/DIG. 2; 332/127; 375/376

(56) References Cited

U.S. PATENT DOCUMENTS

| | | | | |
|---|---|---|---|---|
| 4,987,386 A | * | 1/1991 | Poklemba et al. ............ 331/10 |
| 5,065,408 A | * | 11/1991 | Gillig ........................... 375/222 |
| 5,420,545 A | * | 5/1995 | Davis et al. ................... 331/17 |
| 5,754,598 A | * | 5/1998 | Barrett et al. ................ 375/327 |
| 5,821,816 A | * | 10/1998 | Patterson ..................... 331/1 A |
| 5,907,253 A | * | 5/1999 | Davis et al. ................. 327/156 |
| 6,356,156 B2 | * | 3/2002 | Wesolowski .................. 331/10 |
| 6,542,013 B1 | * | 4/2003 | Volk et al. ................... 327/115 |
| 6,630,868 B2 | * | 10/2003 | Perrott et al. ................. 331/17 |

* cited by examiner

Primary Examiner—My-Trang Nu Ton
(74) Attorney, Agent, or Firm—Wagner, Murabito & Hao LLP (57) ABSTRACT

A non-integer order controller for providing stability in a circuit. The non-integer order controller may be in either a feed-forward path or a feedback path of the circuit. Thus, the non-integer order controller is operable to provide stability for the circuit. The closed loop system may be a phase lock loop.

20 Claims, 7 Drawing Sheets

STABILITY ROBUSTNESS USING A NON-INTEGER ORDER FILTER IN A CIRCUIT

FIELD OF THE INVENTION

The present invention relates to the field of electronic circuits. Specifically, embodiments of the present invention relate to using a non-integer order controller to increase stability robustness.

BACKGROUND ART

As is well understood, the closed loop gain of system may be given by equation 1, in which G(s) is the forward transfer function, H(s) is the feedback transfer function.

$$\text{Out}(s)/\text{In}(s) = G(s)/(1 + HG(s)) \qquad \text{Equation 1}$$

Figure 1:
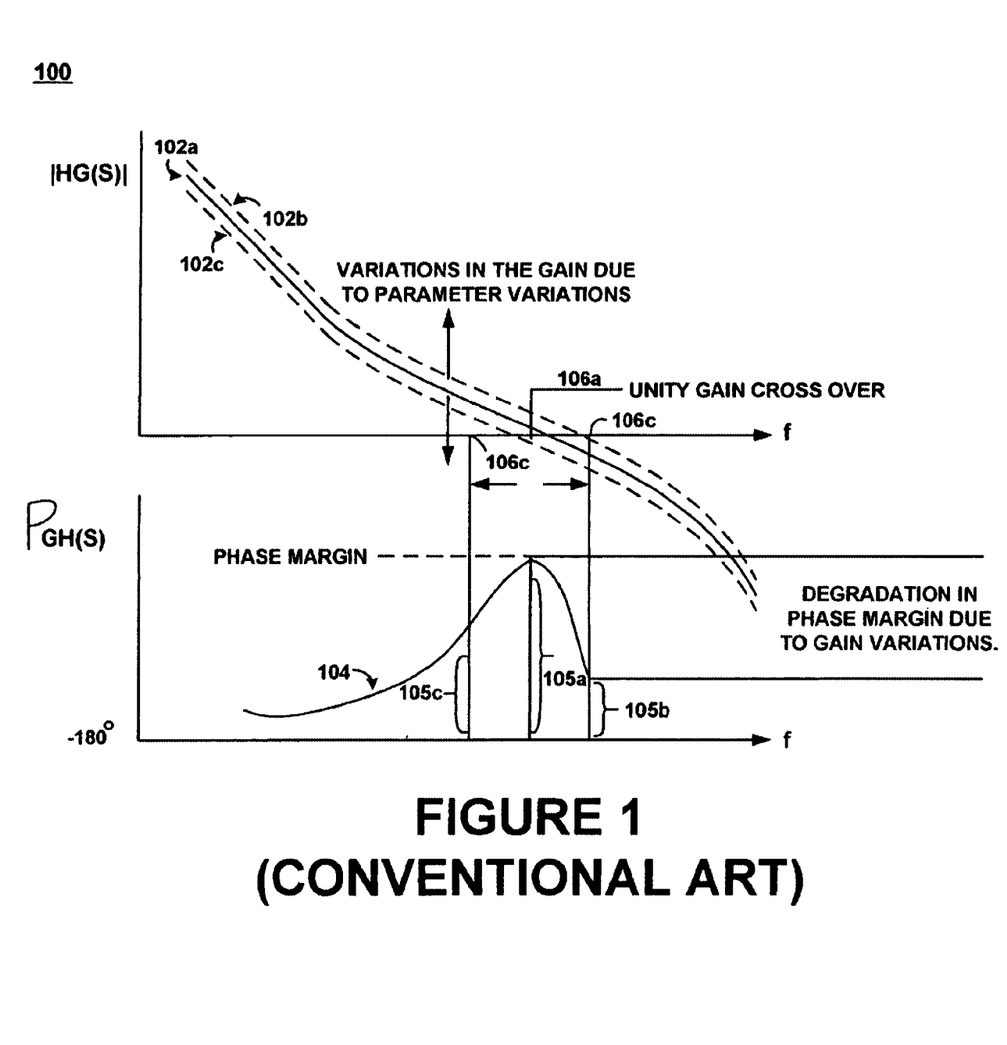
FIG. 1 is graph illustrating magnitude and phase margins in a conventional system.

As is readily discernable from Equation 1, the closed loop system becomes unstable at any frequency that renders the open loop transfer function to have a unity magnitude (e.g., $|HG(s)|=1$) and a phase=180°, which results in a divide by zero. Referring to FIG. 1, conventional systems are designed to have a target phase margin to provide suitable stability by avoiding this region. However, variations related to environmental conditions, aging of components, may cause the phase margin provided by a conventional controller to slide up or down the frequency axis leading to phase margin degradation at the target frequency for which it was designed. Thus, a conventional controller that is designed to provide stability can contribute to destabilizing the system.

FIG. 1 shows a graph 100 showing the open loop frequency response of a system showing magnitude versus frequency curves 102a–c on the top and a phase versus frequency curve 104 directly below. The phase margin 105 is defined as the difference between 180° and the phase at the unity gain crossing of the complex open loop transfer function. The gain of the system is subject to fluctuation due to variations in parameters such as temperature, age, and process. The magnitude curve 102a represents the case without parameter variation and magnitude curves 102b and 102c correspond to fluctuations due to variations. These variations alter the unity gain crossing 106a–c, which in turn alter the point on the phase curve 104 that defines that phase margin 105. Thus, the phase margin degrades due to the gain variations, as indicated by the phase margins 105b and 105c as compared to phase margin 105a.

Thus, conventionally, the open loop gain, HG(s), is designed such that the closed loop system has a target phase and gain margin at the unity gain of the open loop transfer functions. However, variations related to process, temperature, and aging erode the margins and lead to instability. For example, as the phase and gain margins degrade, the system gets closer and closer to the instability region defined by unity gain and phase close to 180°.

In addition to being stable, circuits such as phase lock loops should have other desirable properties such as quick settling times, low overshoot, and fast lock-time. Unfortunately, conventional circuits often are designed with transfer functions that lead to significant overshoot, long settling times, and long lock-times. For example, it can be difficult to design a system that is both stable and has the properties mentioned.

SUMMARY OF THE INVENTION

Therefore, it would be advantageous to provide a method and device for a closed loop device that provides stability. It would be further advantageous if the circuit has reduced sensitivity to parameter variations compared to conventional systems. The parameters may be related to temperature, process, and component aging. It would be further advantageous to provide a method and device for improving overshoot, settling times, and lock time of a circuit, such as a phase lock loop. Embodiments of the present invention provide these advantages and others not specifically mentioned above but described in the sections to follow.

Embodiments of the present invention provide a method and device for providing stability robustness improvements in a closed loop circuit. Embodiments of the present invention improve phase lock loop (PLL) performances such as lock time, overshoot, etc. Embodiments of the present invention may be used in the PLL circuits of frequency generating devices in particular and in control feedback systems in general.

The device may comprise a non-integer order controller in either a feed-forward path or a feedback path of the circuit. The non-integer order controller can be tuned to provide stability for the circuit over a wide range of frequencies. The closed loop system may be a phase lock loop.

DETAILED DESCRIPTION OF THE INVENTION

In the following detailed description of the present invention, a method and device for providing robustness stability in a circuit, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Embodiments of the present invention improve stability of a system by providing a constant phase to the open loop transfer function of the system over a significant range of frequencies near the unity gain frequency of the open loop transfer function. This is achieved by placing a non-integer order controller into a closed loop system. Embodiments also improve measures of merit such as rise time, settling time, and lock time. Embodiments of the present invention may be used in a phase lock loop, although the present invention is not so limited.

Figure 2:
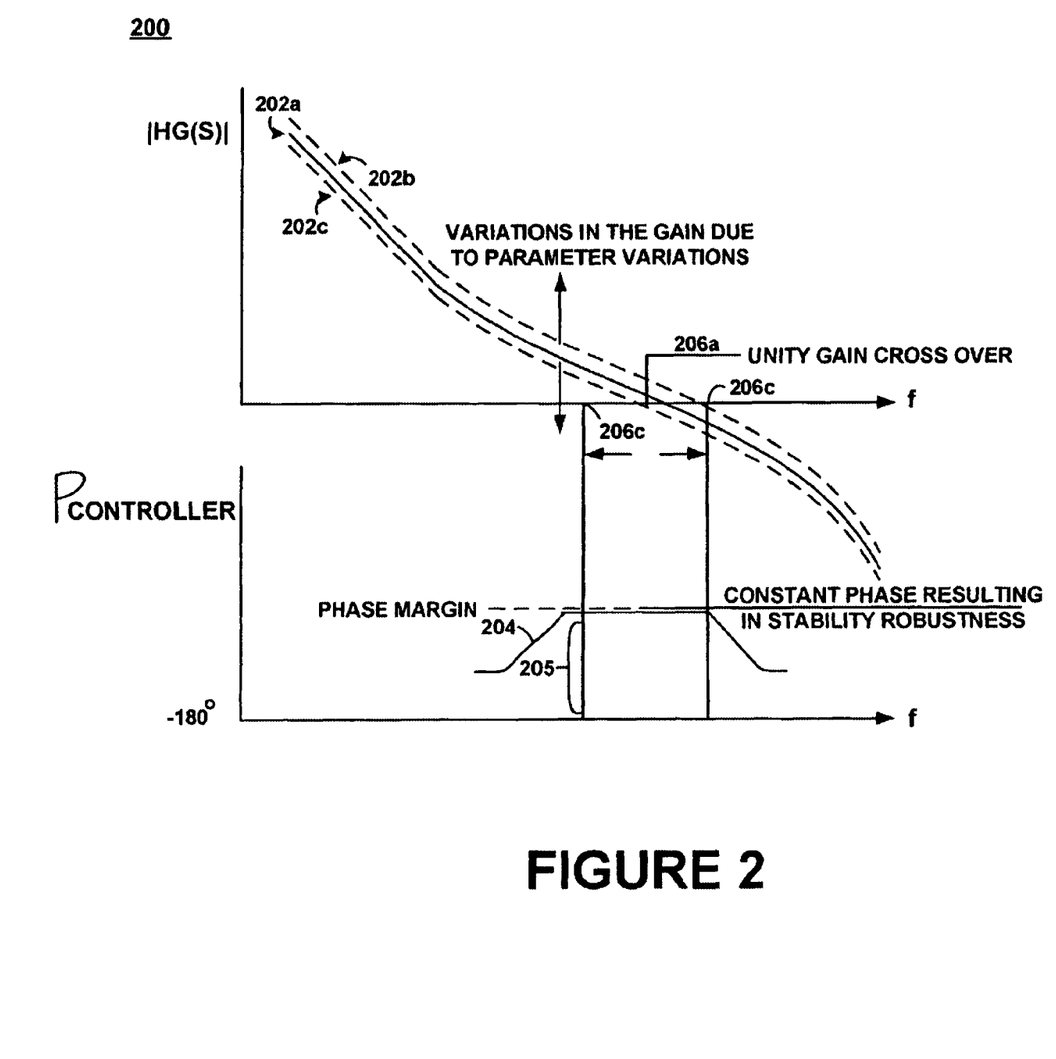
FIG. 2 is a graph illustrating improved phase margin, according to embodiments of the present invention.

FIG. 2 is a graph 200 illustrating phase and magnitude versus frequency, using the non-integer order controller of embodiments of the present invention. The top group of curves 202a–c depict gain in the open loop transfer function including the non-integer order controller, HG(s), and variation thereof due to numerous factors. The lower curve 204 depicts the non-integer order controller's constant phase contribution to provide phase compensation for the open loop, GH(s), over a substantial range of frequencies, according to embodiments of the present invention. The constant phase provides for a constant phase margin 205 over a much wider range of frequencies than does a conventional compensator. A comparison of FIG. 2 with FIG. 1 shows clearly the wider constant phase frequency range.

FIG. 2 illustrates that the non-integer order controller's contribution to the open loop phase response is constant over a wide range of cross over frequencies 206a–c illustrated by curves 202a–c, thus guaranteeing the phase margin 205 over wide range of frequencies.

Moreover, there is an inherent compromise between overshoot and settling time performances of conventional integer order systems. Both of these performances can be improved using non-integer order controllers as in embodiments of the present invention.

Figure 3A:
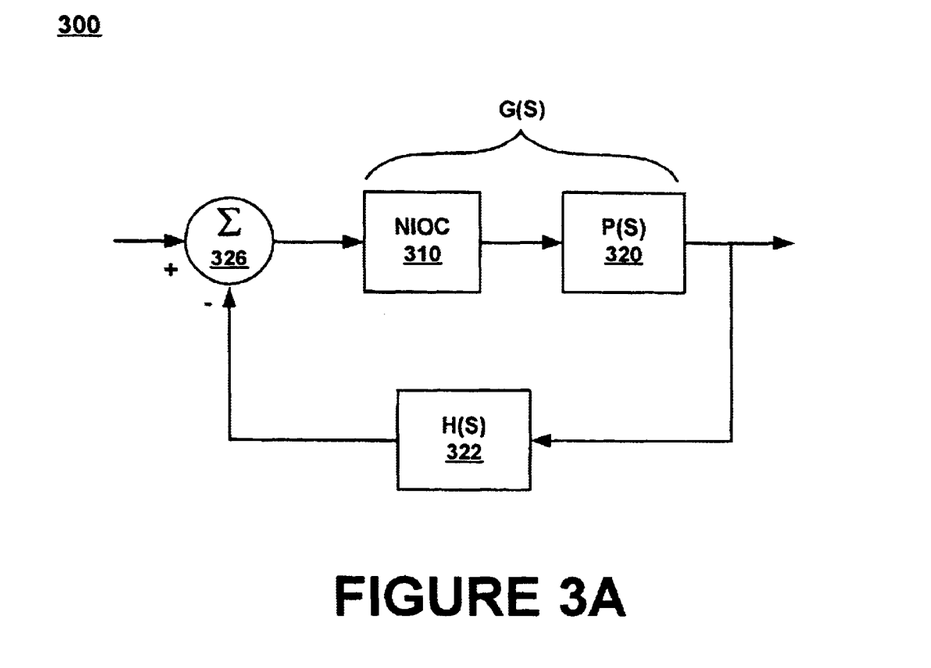
FIG. 3A and FIG. 3B are block diagrams illustrating systems having a non-integer order controller, according to embodiments of the present invention.

Embodiments of the present invention place a non-integer order controller into a closed loop system. Referring to FIG. 3A, the non-integer order controller (NIOC) 310 may be placed into a feed-forward path, G(s). In this implementation, the feed-forward path comprises the NIOC 310 and a process, P(s), which implements an arbitrary desired function for the purpose of which system 300 was designed. The feedback path comprises a transfer function H(s) 322, which is some arbitrary feedback that was designed for the system 300. The system 300 inputs a signal into the summer 326 and outputs a signal from P(s) 320.

Figure 3B:
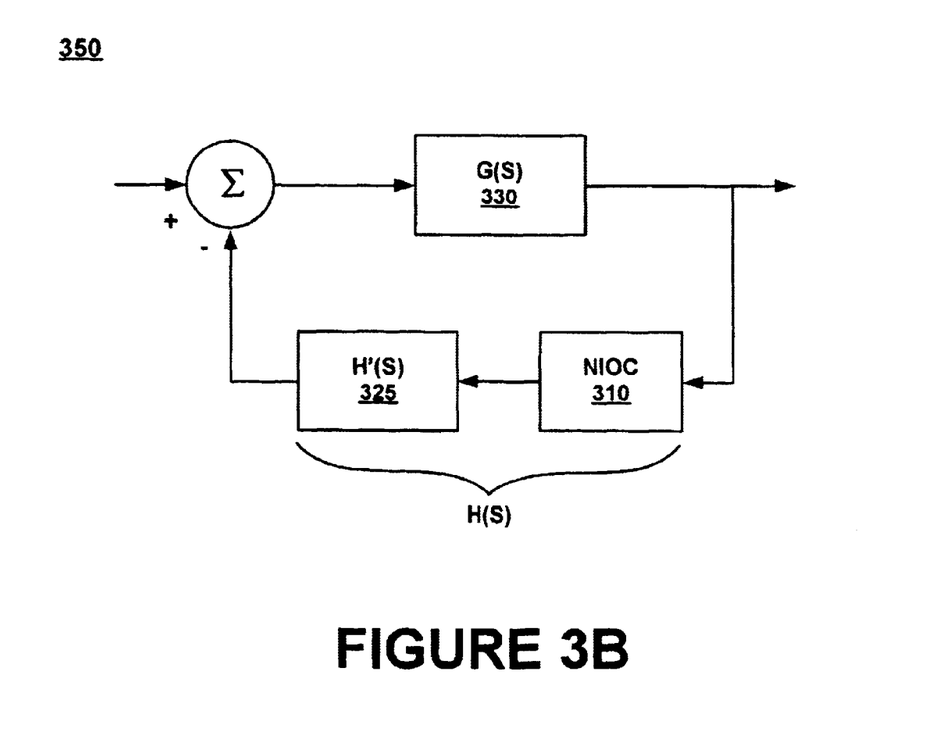

Alternatively, the NIOC 310 may be placed in the feedback path H(s), as in FIG. 3B. In FIG. 3B, H'(s) 325 represents the feedback transfer function without the NIOC 310. Thus, together the NIOC 310 and H'(s) 325 constitute the feedback transfer function H(s). The feed-forward path comprises the transfer function G(s) 330, which is some arbitrary function designed to meet the needs of system 350.

Figure 3C:
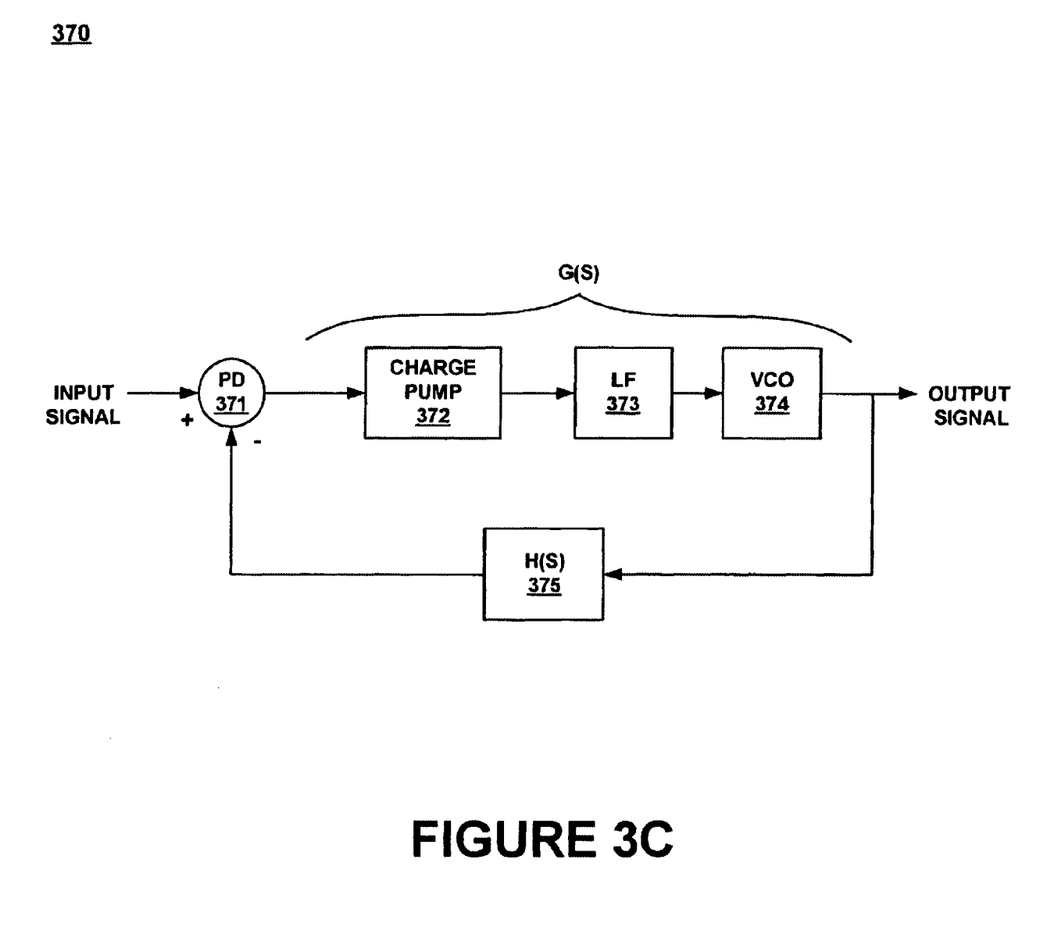
FIG. 3C is a block diagram illustrating a phase lock loop having a non-integer order controller, according to an embodiment of the present invention.

FIG. 3C illustrates yet another embodiment of the present invention, in which a NIOC is added to a phase lock loop 370. The phase lock loop 370 inputs a signal to a phase detector (PD) 371, which is passed on to a charge pump 372. A loop filter (LF) 373 is between the charge pump 372 and a voltage controlled oscillator (VCO) 374, which outputs the signal. The loop filter 373 may contain the NIOC (not depicted). Alternatively, the NIOC may be added as a separate element in either the feed-forward path G(s) or the feedback path H(s) 375.

Advantageously, figures of merit such as rise time, settling time, overshoot, and lock time are better in the PLL of FIG. 3C than a conventional PLL. By using a suitable NIOC, various figures and merit can also be made better for the general closed loop systems shown in FIGS. 3A and 3B as compared to a conventional system.

Figure 4:
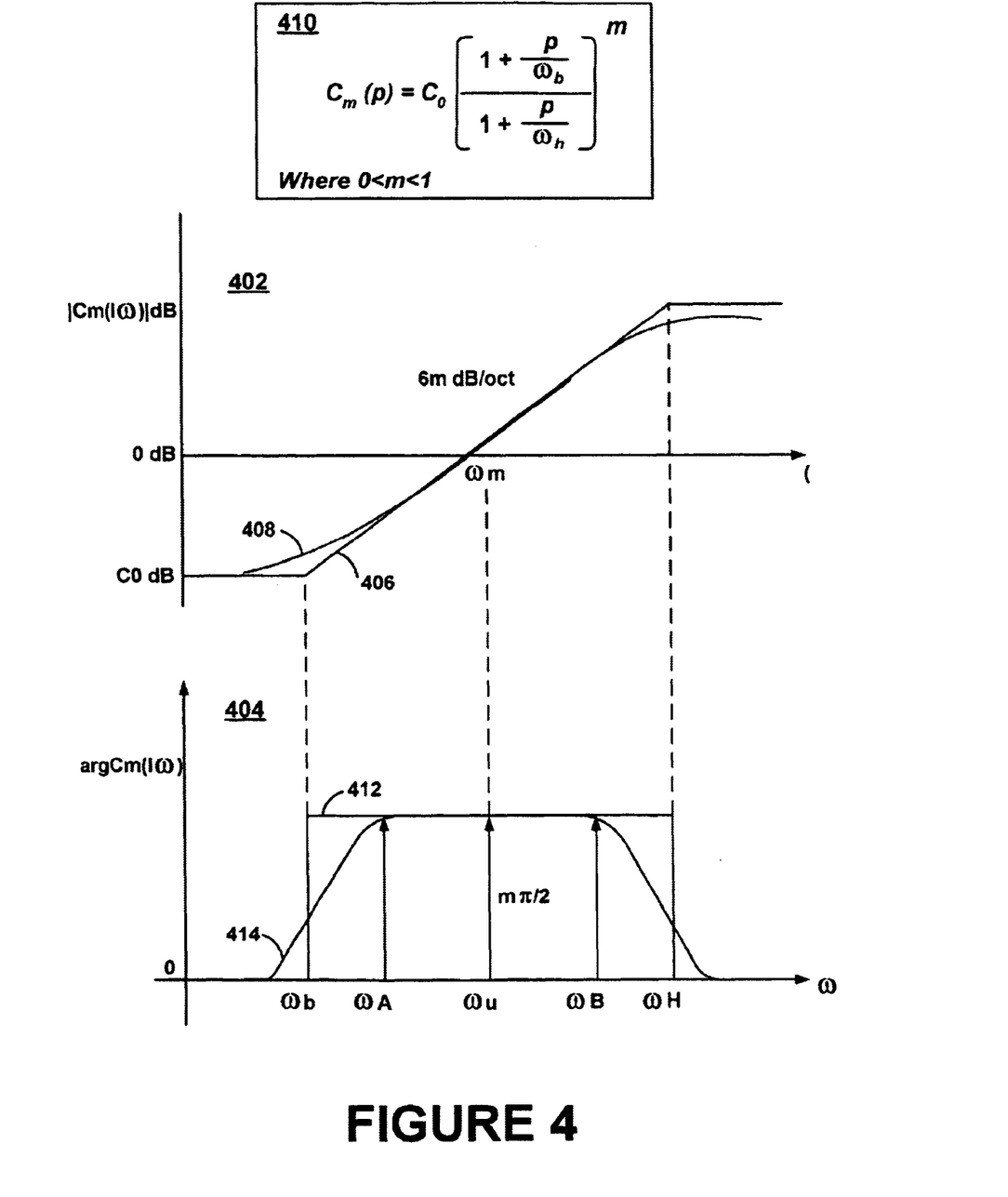
FIG. 4 illustrates an equation of an ideal non-integer order function and its magnitude and phase bode plots.

FIG. 4 illustrates a Bode plot of magnitude 402 and phase 404 for an ideal non-integer order differentiator, as well as an equation 410 for the transfer function of the non-integer order differentiator. The magnitude graph 402 has a magnitude asymptotic curve 406 showing the asymptotes that the magnitude approaches in each region. The magnitude graph 402 also has a magnitude curve 408 representing the actual magnitude response. The magnitude asymptotic curve 406 has corners at $\omega_b$ and $\omega_h$, which are in the numerator and denominator of the non-integer order differentiator equation 410. The magnitude asymptotic curve 406 increases at 6m dB/octave between $\omega_b$ and $\omega_h$ and the actual response curve 408 is very close to that with some rounding at the corner frequencies. In equation 410, 'm' is a real number between 0 and 1. The magnitude asymptotic curve 406 crosses the 0db line at a frequency of $\omega_m$.

The phase graph 404 has a phase asymptotic curve 412, which illustrates the asymptote that the phase response approaches in each region. The actual phase response curve 414 demonstrates some rounding at the corner frequencies, $\omega_b$ and $\omega_h$, but tracks the phase asymptotic curve 412 very closely elsewhere. The phase asymptotic curve 412 has a value of $m\pi/2$ between $\omega_b$ and $\omega_h$ and the actual phase curve 414 is very close to $m\pi/2$ between $\omega_b$ and $\omega_h$ with some roll-off near the corner frequencies at $\omega_A$ and $\omega_B$. Thus, the phase response is constant over a wide range of frequencies near the frequency of the 0db magnitude response (shown as $\omega_u$ on the phase graph 404 and $\omega_m$ on the magnitude graph 402).

In the equation 410, m may take on any value between 0 and 1. Thus, equation 410 may be stated to have a single pole and a single zero created by the $p/\omega_b$ and $p/\omega_h$ terms, and to be of the $m_{th}$ order, where m is a non-integer.

Figure 5:
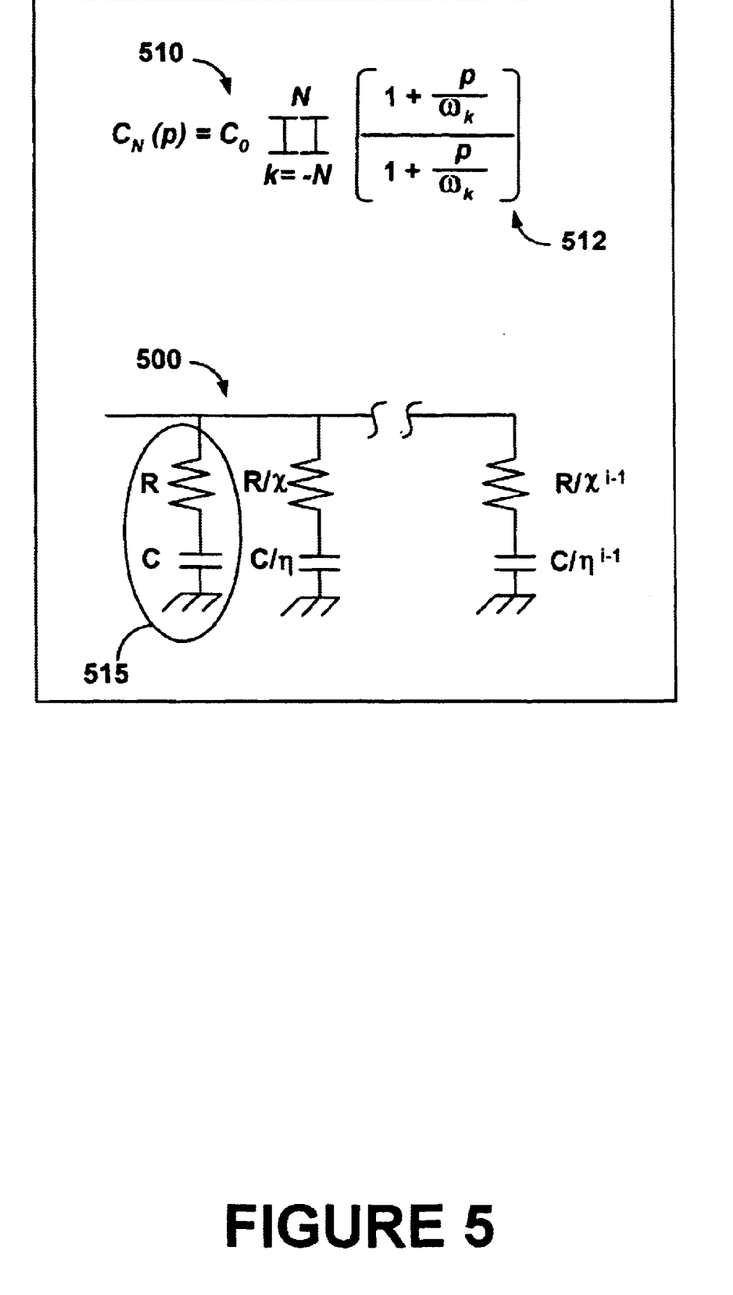
FIG. 5 illustrates an equation approximating a non-integer order function and a related circuit for implementing a non-integer order controller, according to an embodiment of the present invention.

A practical implementation of the ideal NIOC of FIG. 4 is illustrated in FIG. 5, which illustrates an exemplary circuit 500 for implementing a non-integer order controller using a recursive distribution of resistive-capacitive circuit branches 515, according to an embodiment of the present invention. FIG. 5 also shows an equation 510 governing the circuit 500. Such a circuit 500 may be used in implementing the NIOC 310 of FIGS. 3A–3B and the loop filter 373 in FIG. 3C.

In equation 510, $C_N$ is a function of p, where p is Laplace complex variable. In the equation 510, $C_O$ is a constant. The terms $\omega_k^{-1}$ and $\omega_k$ indicate frequency corners corresponding to zero and pole occurrences, respectively. Thus, equation 510 approximates the ideal case shown in FIG. 4 in which there is only one pole and one zero. The equation 510 may have an adequate number of product terms 512, depending on the desired accuracy and system requirements. Likewise, the circuit 500 may have an adequate number of branches 515.

The circuit 500 has branches 515 in a recursive configuration. Thus, the configuration is operable to implement the equation 510 to whatever value of "N" is desired. In this example, each branch 515 has a resistor and a capacitor. However, the present invention is not limited to a resistor/capacitor implementation. For example, the non-integer order controller could be implemented with inductors instead of capacitors. Also, inductances can be used to represent other phenomena not detailed here such as where the use of resistors and capacitors only is not deemed sufficient to meet the requirements of the system under control. The value of the first resistor is "R", the second resistor is, "R/$\alpha$", the third resistor is, "R/$\alpha^2$", etc. The first capacitor has a value of "C", the second capacitor is, "C/$\eta$", the third is capacitor "C/$\eta^2$" etc. The calculation of values for $\alpha$ and $\eta$ will be discussed below. Any number of branches 515 may be used, depending on the accuracy desired. Thus, the capacitors can easily be fabricated with existing processing techniques without consuming substantial area in a chip. Thus, cost savings are realized by embodiments of the present invention.

Figure 6:
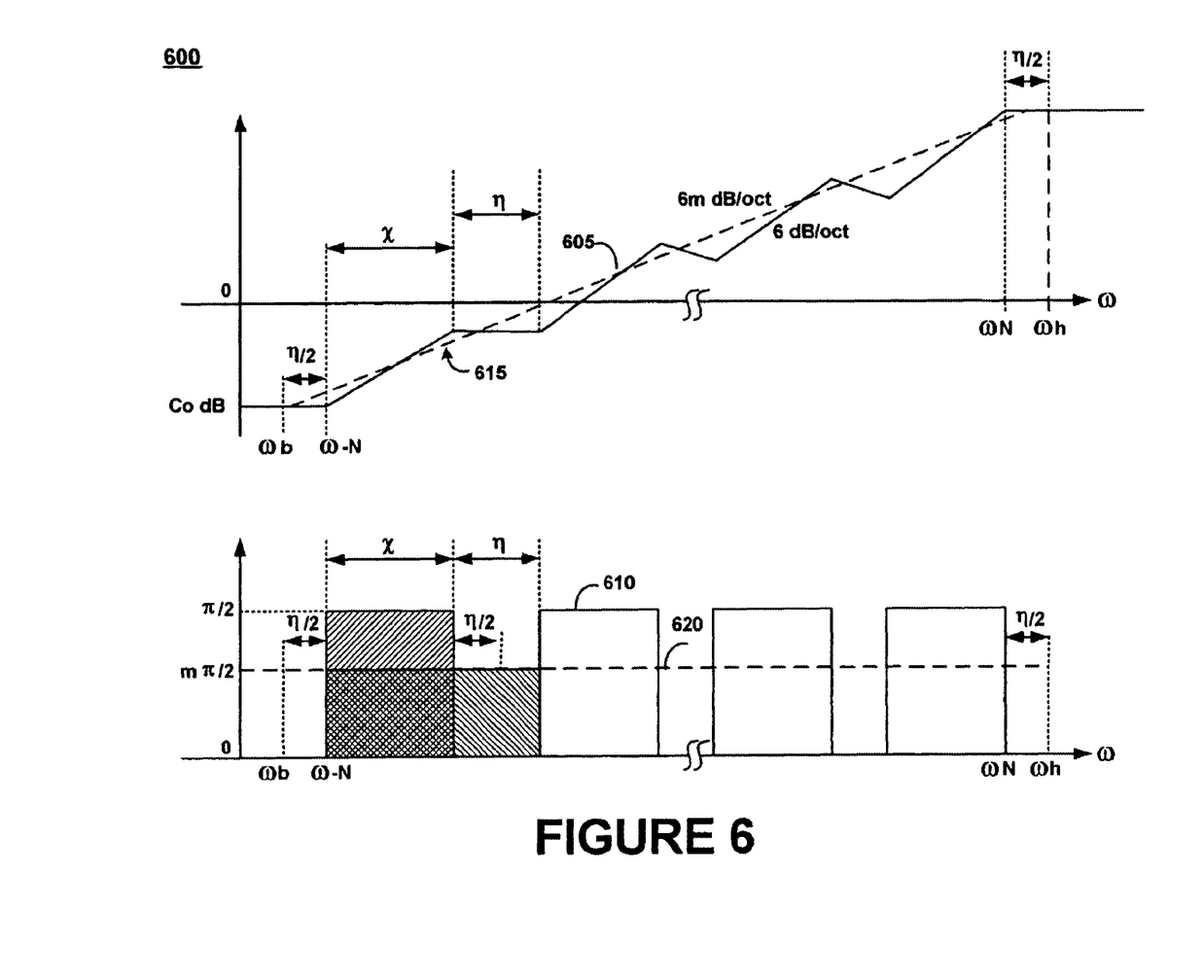
FIG. 6 is a graph showing magnitude and phase versus frequency for a non-integer order controller, according to an embodiment of the present invention.

FIG. 6 illustrates a graph 600 of magnitude and phase of an exemplary non-integer order controller provided by embodiments of the present invention. As the bode plots in FIG. 6 indicate, the response quite closely approximates the ideal case illustrate in FIG. 4. The solid curves 605, 610 represent the asymptotic magnitude and phase responses, respectively. For example, in the region labeled "a", the asymptotic magnitude response 605 has an asymptote defined by the solid curve in that region with a 6 dB/octave gain. In the region labeled "η", the asymptotic magnitude curve 605 has an asymptote defined by the solid curve in that region with a 0 dB/octave gain.

The dashed lines represent the average magnitude 615 and phase 620 responses. For example, those curves 615, 620 represent the average of the asymptotic curves 605, 610. The average magnitude and phase curves 615, 620 approximate very well the response with ideal components. The average phase response 620 is constant across the range of frequencies shown. The range may easily be controlled, as described below.

The general process for calculating the values of α and η is as follows. First, a desired frequency range over which a constant phase response is desired is determined. Referring to FIG. 6, the upper frequency is $\omega_h$ and the lower frequency is $\omega_b$. Any desired frequencies may be selected. Next, a suitable value for N is determined. The variable N corresponds to how many product terms 512 are in the equation 510 in FIG. 5 and also the number of branches 515 in the circuit 500. Referring to the graph 600 of FIG. 6, greater "N" will correspond to more corner frequencies.

For example, "N" may be computed such that αη=5. However, other values than 5 may be used. Then, the ideal NOIC may be computed by determining its non-integer order "m" from the desired phase margin at the desired unity gain frequency of the open loop transfer function. For example, in FIG. 3A, assuming H(p)=1, C(p) the NOIC and G(p) is the process, "m" can be obtained from equation 2.

$$\text{Equation 2: } \phi_m = m\frac{\pi}{2} + \arg G(j\omega_u) - \pi$$

Then, $\omega_b$ and $\omega_h$ may be computed based on the range of frequencies over which the phase compensation is desired to be constant. Finally, the NOIC DC gain may be computed from equation 3.

$$|C(j\omega_u)G(j\omega_u)|=|C(j\omega_u)||G(\omega_u)|=1 \quad \text{Equation 3}$$

After the ideal controller version is synthesized, its non-ideal implementation may then calculated using equations 4–8 below. These formulas may be directly deduced from the graph 600.

The parameter "m" is the order of the non-integer order controller provided by embodiments of the present invention. In FIG. 6, the average magnitude curve 615 increases at a rate of 6m dB/octave. The average phase curve 620 has a constant phase equal to m*π/2. Thus, the average curves 615, 620 have values that very closely approximate the ideal curves in FIG. 4. Values for α and η may be computed using the following formulas.

$$\alpha=[\omega_h/\omega_b]^{m/(2N-1)} \quad \text{Equation 4}$$

$$\eta=[\omega_h/\omega_b]^{(1-m)/(2N+1)} \quad \text{Equation 5}$$

$$\alpha=\omega_k/\omega'_k \quad \text{Equation 6}$$

$$\eta=\omega'_{k+1}/\omega_k \quad \text{Equation 7}$$

$$\alpha\eta=\omega'_{k+1}/\omega'_k=\omega_{k+1}/\omega_k \quad \text{Equation 8}$$

In one embodiment, the non-integer order controller is implemented digitally. For example, the circuit 500 of FIG. 5 or the like may be computer simulated. Alternatively, tailor expansion may be performed on equation 510 of FIG. 5. Thus, the NIOC 310 in FIGS. 3A and 3B and the loop filter 373 of FIG. 3C may be implemented digitally, at least in part.

The preferred embodiment of the present invention, a method and device for providing robustness of the degree of stability in a circuit, is thus described. While the present invention has been described in particular embodiments, it should be appreciated that the present invention should not be construed as limited by such embodiments, but rather construed according to the below claims.

What is claimed is:

1. A device for providing stability in a circuit comprising:
a non-integer order controller in one of a feed-forward path and a feedback path of said circuit, wherein said non-integer order controller is operable to provide stability for said circuit.

2. The device of claim 1, wherein said non-integer order controller is in said feed-forward path.

3. The device of claim 1, wherein said non-integer order controller is in said feedback path.

4. The device of claim 1, wherein said circuit is a phase lock loop.

5. The device of claim 4, wherein poles and zeroes of said non-integer order controller each have a respective predetermined value to minimize a settling time of said phase lock loop.

6. The device of claim 1, wherein said non-integer order controller comprises circuit elements configured in a recursive pattern.

7. The device of claim 1, wherein said non-integer order controller is implemented with computer software.

8. A method of providing stability to a system, comprising:
a) receiving a signal in a closed loop system;
b) modifying said signal with a non-integer order function to provide stability to said system; and
c) passing said signal along in said closed loop system.

9. The method of claim 8, wherein said system comprises a phase lock loop.

10. The method of claim 8, wherein said b) comprises modifying said signal using software.

11. The method of claim 8, wherein said b) comprises modifying said signal using hardware.

12. The method of claim 8, wherein said a) comprises receiving said signal from a feed-forward path of said closed loop system.

13. The method of claim 8, wherein said a) comprises receiving said signal from a feedback path of said closed loop system.

14. A phase lock loop circuit comprising:
a feed-forward path;
a feedback path coupled to said feed-forward path; and
a non-integer order controller in one of said feed-forward path and said feedback path and operable to provide stability.

15. The phase lock loop circuit of claim 14, wherein said non-integer order controller comprises circuit elements in a recursive pattern.

16. The phase lock loop circuit of claim 15, wherein said circuit elements comprise resistors and capacitors.

17. The phase lock loop circuit of claim 14, wherein said non-integer order controller is further operable as a low pass filter.

18. The phase lock loop circuit of claim 14, wherein poles and zeroes of said non-integer order controller have pre-determined values to minimize a settling time of said phase lock loop.

19. The phase lock loop circuit of claim 14, wherein said non-integer order controller comprises poles and zeroes that are operable to simulate a single pole/single zero filter of order m, wherein m is a non-integer and wherein m is a pre-determined value operable to improve a figure of merit of said phase lock loop.

20. The phase lock loop circuit of claim 19, wherein said value of m is operable to reduce a locking time of said phase lock loop as compared to an integer order controller.

* * * * *